(12) United States Patent
Pourquier et al.

(10) Patent No.: US 11,171,267 B2
(45) Date of Patent: Nov. 9, 2021

(54) PROCESS FOR FABRICATING AN OPTOELECTRONIC DEVICE INCLUDING PHOTOLUMINESCENT PADS OF PHOTORESIST

(71) Applicant: ALEDIA, Grenoble (FR)

(72) Inventors: Eric Pourquier, Grenoble (FR); Philippe Gilet, Teche (FR); Chang Ying-Lan, Cupertino, CA (US)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 16/473,807

(22) PCT Filed: Dec. 22, 2017

(86) PCT No.: PCT/FR2017/053826
§ 371 (c)(1),
(2) Date: Jun. 26, 2019

(87) PCT Pub. No.: WO2018/122520
PCT Pub. Date: Jul. 5, 2018

(65) Prior Publication Data
US 2019/0334064 A1    Oct. 31, 2019

(30) Foreign Application Priority Data
Dec. 27, 2016 (FR) ..................... 1663410

(51) Int. Cl.
*H01L 33/60* (2010.01)
*H01L 27/15* (2006.01)
*H01L 33/50* (2010.01)

(52) U.S. Cl.
CPC .......... *H01L 33/505* (2013.01); *H01L 27/156* (2013.01); *H01L 33/504* (2013.01); *H01L 33/60* (2013.01); *H01L 2933/0041* (2013.01)

(58) Field of Classification Search
CPC ......... H01L 27/15; H01L 33/50; H01L 33/60; H01L 2933/0041; H01L 27/156;
(Continued)

(56) References Cited

U.S. PATENT DOCUMENTS

2011/0227106 A1    9/2011  Watkins
2014/0124767 A1*   5/2014  Maindron ........... H01L 51/5253
                                                         257/40
(Continued)

FOREIGN PATENT DOCUMENTS

JP    2004-071357    3/2004
WO    2014/140505    9/2014

*Primary Examiner* — Didarul A Mazumder
(74) *Attorney, Agent, or Firm* — Occhiuti & Rohlicek LLP

(57) ABSTRACT

The invention relates to a method for producing an optoelectronic device (1) including a matrix array of light-emitting diodes (4) and a plurality of photoluminescent pads ($6_1$, $6_2$, $6_3$ ... ) that are each located facing at least some of said light-emitting diodes (4), including the following steps:
forming said plurality of photoluminescent pads ($6_1$, $6_2$, $6_3$ ... ) by photolithography from at least one photoresist ($5_1$, $5_2$, $5_3$ ... ) containing photoluminescent particles, said photoresist having been deposited beforehand on a supporting surface (3; 3');
forming reflective walls (101, 102, 103 ... ) covering lateral flanks ($8_1$, $8_2$, $8_3$ ... ) of said photoluminescent pads ($6_1$, $6_2$, $6_3$ ... ) by deposition of at least one thin-layer section ($9_1$, $9_2$, $9_3$ ... ) on the lateral flanks.

16 Claims, 7 Drawing Sheets

(58) Field of Classification Search
CPC . H01L 33/504; H01L 33/505; H01L 51/5253; H01L 33/20
USPC .............................................. 257/79; 438/22
See application file for complete search history.

(56) References Cited

U.S. PATENT DOCUMENTS

| | | |
|---|---|---|
| 2015/0221619 A1 | 8/2015 | Rhee |
| 2016/0061993 A1* | 3/2016 | Ren ........................ G02B 5/30 349/62 |
| 2016/0141469 A1 | 5/2016 | Robin et al. |
| 2016/0155900 A1 | 6/2016 | Bono et al. |
| 2016/0197064 A1 | 7/2016 | Bouvier et al. |
| 2016/0276329 A1* | 9/2016 | Bono ...................... H01L 33/20 |

* cited by examiner

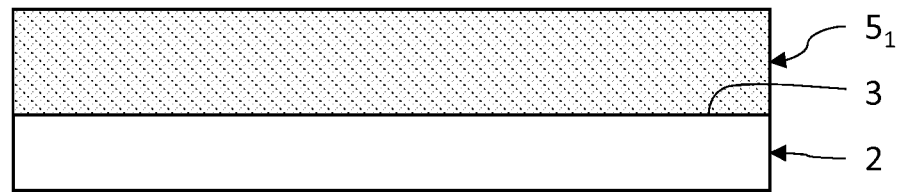
Fig.1A
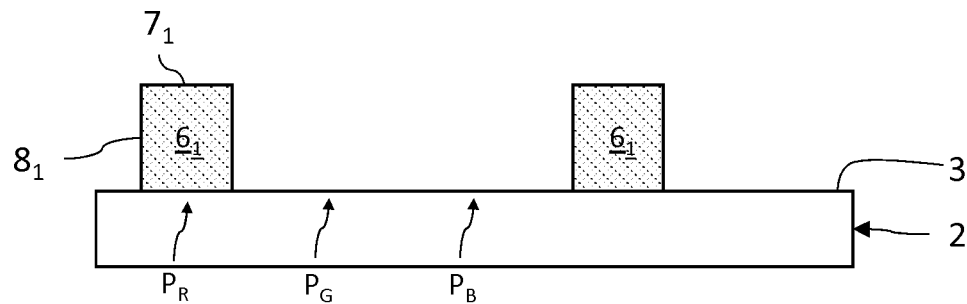
Fig.1B
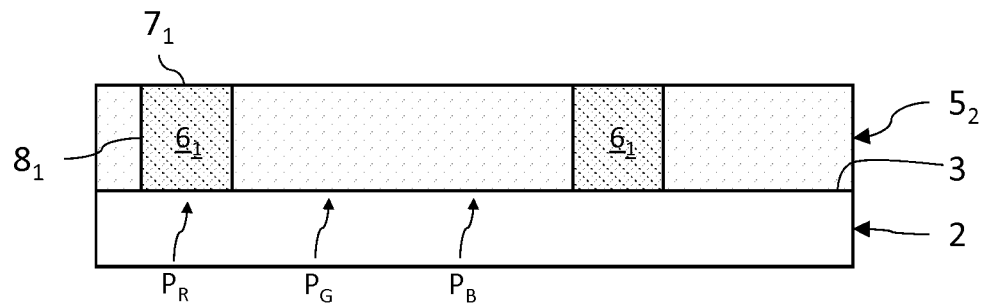
Fig.1C
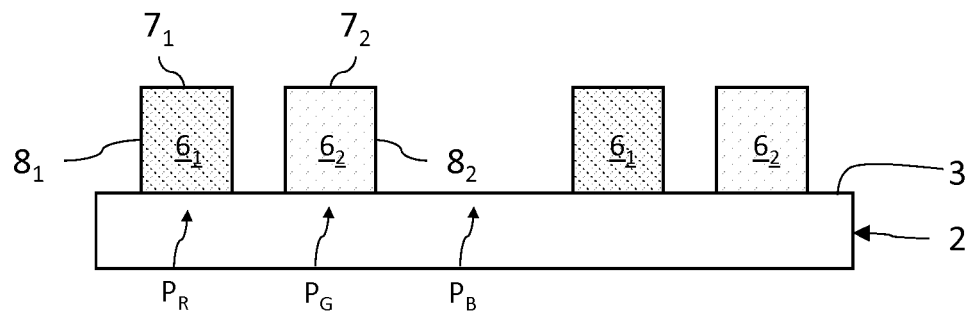
Fig.1D
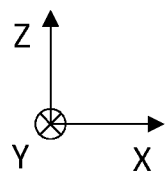

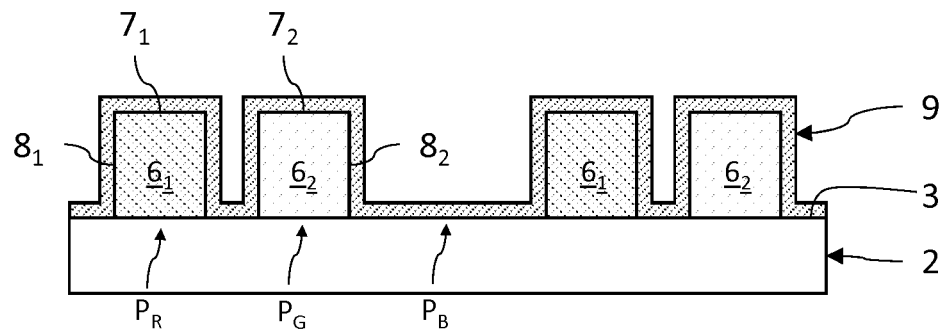
Fig.1E
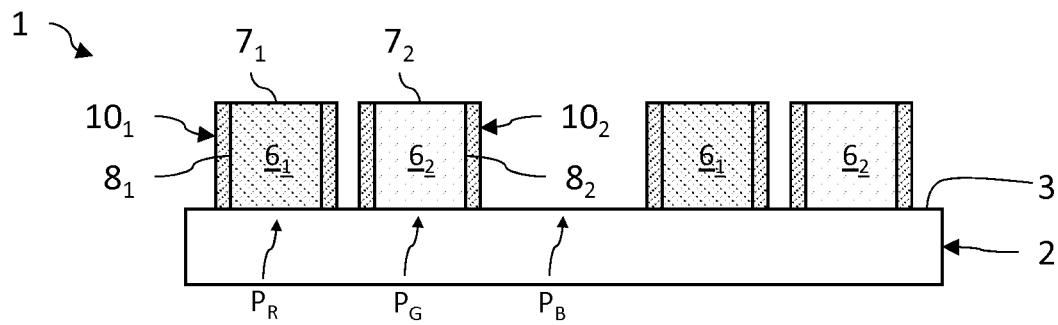
Fig.1F
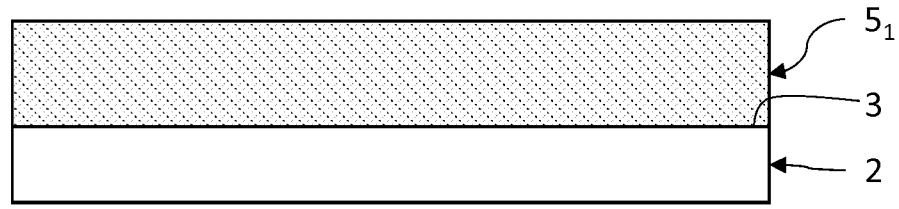
Fig.2A
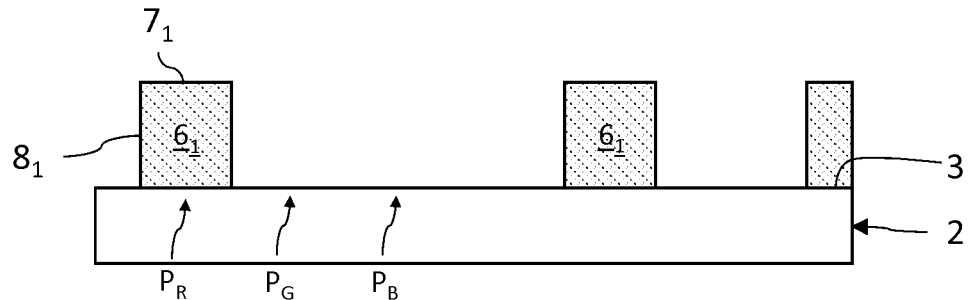
Fig.2B
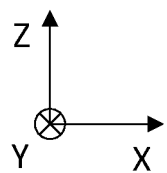

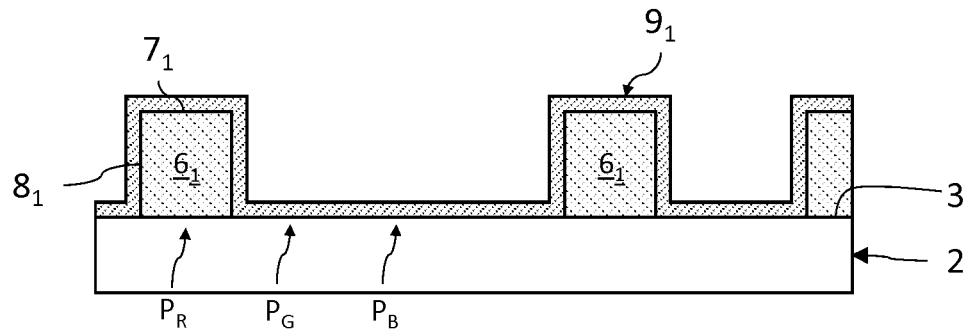
Fig.2C
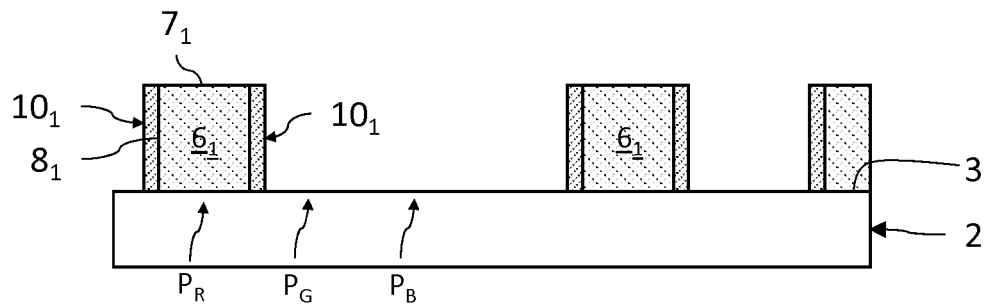
Fig.2D
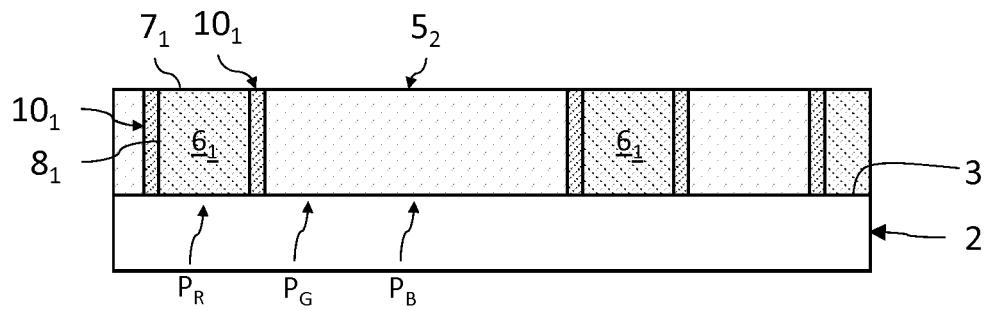
Fig.2E
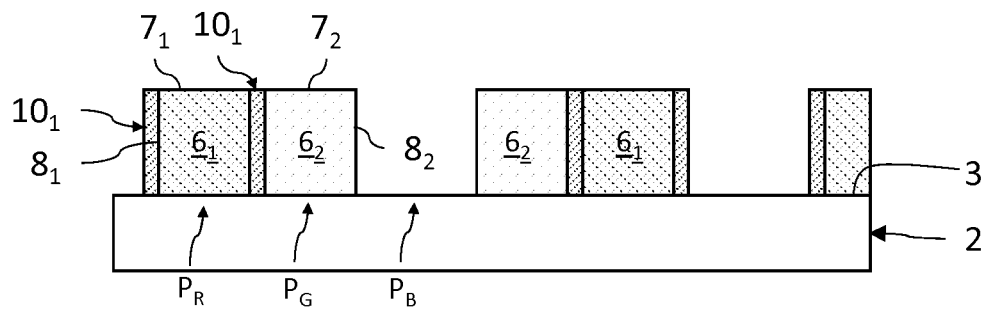
Fig.2F
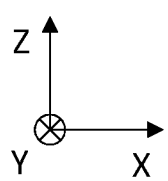

PROCESS FOR FABRICATING AN OPTOELECTRONIC DEVICE INCLUDING PHOTOLUMINESCENT PADS OF PHOTORESIST

CROSS REFERENCE TO RELATED APPLICATIONS

This application is a National Stage of International Application No. PCT/FR2017/053826 filed on Dec. 22, 2017, which claims priority to French Application No. 1663410 filed on Dec. 27, 2016, the contents of which are hereby incorporated by reference in their entirety.

TECHNICAL FIELD

The field of the invention is that of methods for manufacturing optoelectronic devices including light-emitting diodes associated with photoluminescent pads. The invention is especially applicable to display screens or systems for projecting images.

PRIOR ART

Various optoelectronic devices exist which include a matrix array of light-emitting diodes having an emission surface, this emission surface being at least partially coated with photoluminescent pads. Such optoelectronic devices may form display screens or image-projecting systems including a matrix array of luminous pixels of various colours.

The light-emitting diodes may be based on a semiconductor comprising elements from column III and column V of the periodic table (such as a III-V compound) and especially gallium nitride (GaN), indium gallium nitride (InGaN) or aluminium gallium nitride (AlGaN). They are arranged so as to form a matrix array of light-emitting diodes having an emission surface through which the light radiation emitted by the light-emitting diodes is transmitted.

In the case of a display screen or an image-projecting system, the optoelectronic device may thus include a matrix array of luminous pixels, each luminous pixels including one or more light-emitting diodes. With the aim of obtaining luminous pixels suitable for emitting light of various colours, for example blue, green or red, the light-emitting diodes may be designed to emit blue light, and certain luminous pixels may include photoluminescent pads suitable for at least partially absorbing the blue light emitted by the light-emitting diodes and emitting, in response, green or red light. The photoluminescent pads are conventionally formed from a binding matrix including particles of a photoluminescent material such as cerium-doped yttrium aluminium garnet (YAG:Ce).

Generally, there is a need to provide a method for manufacturing an optoelectronic device allowing resolution to be increased while optimising contrast.

SUMMARY OF THE INVENTION

The aim of the invention is to provide a method for manufacturing an optoelectronic device including light-emitting diodes and photoluminescent pads, said method allowing high-resolution and high-contrast optoelectronic devices to be obtained.

To this end, one subject of the invention is a method for manufacturing an optoelectronic device for producing an optoelectronic device including a matrix array of light-emitting diodes and a plurality of photoluminescent pads that are each located facing at least some of said light-emitting diodes, including the following steps:

forming said plurality of photoluminescent pads by photolithography from at least one photoresist containing photoluminescent particles, said photoresist having been deposited beforehand on a supporting surface;

forming reflective walls covering lateral flanks of said photoluminescent pads by deposition of at least one thin-layer section on the lateral flanks.

The following are certain preferred but nonlimiting aspects of this method.

The step of forming the reflective walls may include conformally depositing at least one thin layer made of a reflective material so as to cover the photoluminescent pads, then locally etching the deposited thin layer so as to free what is referred to as an upper surface of the photoluminescent pads, said upper surface being located opposite said supporting surface.

The steps of forming the plurality of photoluminescent pads and of forming the reflective walls may include the following steps:

forming a plurality of first photoluminescent pads by photolithography from a first photoresist containing first photoluminescent particles, said first photoresist having been deposited beforehand on said supporting surface;

forming first reflective walls covering lateral flanks of said first photoluminescent pads by conformally depositing a thin reflective layer on the first photoluminescent pads and then etching locally so as to free an upper surface of the first photoluminescent pads; and forming a plurality of second photoluminescent pads by photolithography from a second photoresist containing second photoluminescent particles, said second photoresist having been deposited beforehand on said supporting surface, the second photoluminescent particles being different from the first photoluminescent particles.

The method may include, following the step of forming the plurality of second photoluminescent pads, the step of:

forming second reflective walls covering lateral flanks of said second photoluminescent pads by conformally depositing a thin reflective layer on the first and second photoluminescent pads, then etching locally so as to free the upper surface of the first and second photoluminescent pads.

Each second photoluminescent pad makes preferably contact with at least one first reflective wall.

Each first reflective wall has preferably a thickness comprised between to nm and 500 nm.

The step of forming the plurality of photoluminescent pads may include at least a step of forming a plurality of first photoluminescent pads containing first photoluminescent particles and then forming a plurality of second photoluminescent pads containing second photoluminescent particles that are different from the first photoluminescent particles, the step of forming the reflective walls being carried out after at least the first and second photoluminescent pads have been formed.

The reflective walls are preferably formed by electrodeposition.

The average size of the photoluminescent particles is preferably 500 nm or less.

The photoluminescent particles are preferably quantum dots and have an average size of 50 nm or less.

The photoluminescent pads have preferably an average height of 30 μm or less.

The light-emitting diodes may be elongate three-dimensional components extending longitudinally substantially orthogonally to a main plane of a supporting layer.

The light-emitting diodes may be located inside the photoresist pads, at least some of which pads are photoluminescent pads including photoluminescent particles.

The photoluminescent pads preferably rest on a supporting surface that is what is referred to as a transmission surface, said supporting surface being formed by a spacer layer covering the light-emitting diodes.

Another subject of the invention is an optoelectronic device, including:
- a matrix array of light-emitting diodes resting on a supporting layer;
- a plurality of first photoluminescent pads that are each located facing at least some of said light-emitting diodes and that are each formed from a first photoresist including first photoluminescent particles, said first photoluminescent pads having lateral flanks covered by a deposited thin-layer section forming a first reflective wall;
- a plurality of second photoluminescent pads that are each located facing at least some of said light-emitting diodes and that are each formed from a second photoresist including second photoluminescent particles that are different from the first photoluminescent particles, said pads having lateral flanks covered by a deposited thin-layer section forming a second reflective wall.

Each second photoluminescent pad makes preferably contact with a first reflective wall.

The light-emitting diodes have preferably a three-dimensional structure that is elongate along a longitudinal axis that is substantially orthogonal to the supporting layer.

The light-emitting diodes are preferably located inside the photoluminescent pads.

The light-emitting diodes have preferably a mesa structure.

BRIEF DESCRIPTION OF THE DRAWINGS

Other aspects, aims, advantages and features of the invention will become more clearly apparent on reading the following detailed description of preferred embodiments thereof, which description is given by way of nonlimiting example and with reference to the appended drawings, in which:

FIGS. 1A to 1F are partial schematic cross-sectional views of various steps of a manufacturing method according to a first embodiment, in which the photoluminescent pads are produced by photolithography from various photoresists containing photoluminescent particles;

FIGS. 2A to 2H are partial schematic cross-sectional views of various steps of a manufacturing method according to a second embodiment, in which the resolution of the pixels may be increased with respect to that obtained using the method according to the first embodiment;

DETAILED DESCRIPTION OF PARTICULAR EMBODIMENTS

Figure 2G:
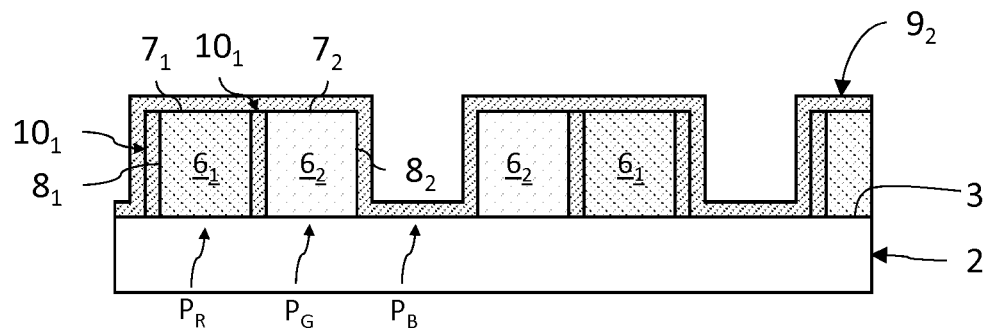

In the figures and in the rest of the description, components that are identical or similar are referenced by the same references. In addition, the various components are not shown to scale to make the figures clearer. Moreover, the various embodiments and variants are not exclusive of one another and may be combined together. Unless otherwise indicated, the terms "substantially", "about" and "of the order of" mean to within 10%.

The invention relates to a method for manufacturing an optoelectronic device including light-emitting diodes and photoluminescent pads. More precisely, the optoelectronic device includes a matrix array of light-emitting diodes that are distributed in various luminous pixels, the photoluminescent pads each being located facing at least some of the light-emitting diodes. By located facing, what is meant is that the photoluminescent pads are located directly opposite the light-emitting diodes and may be spaced apart from or make contact with the latter.

According to one embodiment, details of which are given below, the photoluminescent pads may be located facing the light-emitting diodes and be spaced apart from the latter by a spacer layer. In other words, the photoluminescent pads do not make contact with the light-emitting diodes. They may rest on a supporting surface that is what is referred to as an optical transmission surface of the spacer layer. The transmission surface is that surface of the spacer layer through which the light radiation that is what is referred to as excitation radiation, emitted by the light-emitting diodes in the direction of the photoluminescent pads, is transmitted. As a variant, the transmission surface may be a surface of a transparent plate on which the photoluminescent pads have been produced beforehand, the transparent plate then being added and fastened to the matrix array of light-emitting diodes, for example on the spacer layer.

According to another embodiment, details of which are given below, the photoluminescent pads may be located facing the light-emitting diodes and making contact with the latter. In other words, in a luminous pixel, the light-emitting diodes are located inside and making contact with the corresponding photoluminescent pad. The photoluminescent pad then surrounds each of the corresponding light-emitting diodes. The light-emitting diodes and the photoluminescent pads rest on one and the same supporting surface of what is referred to as a supporting layer. This embodiment is more particularly of relevance to wire light-emitting diodes.

The photoluminescent pads are suitable for at least partially converting the excitation light radiation emitted by the light-emitting diodes into what is called luminescent light radiation of a different wavelength. Each photoluminescent pad includes a binding matrix that is transparent to the excitation and luminescent light radiation and in which photoluminescent particles are dispersed. The photoluminescent pads rest on a supporting surface, for example a surface of a supporting layer on which the light-emitting diodes also rest, or a surface of a transparent spacer layer that covers the light-emitting diodes, or even a surface of an added transparent plate. Each photoluminescent pad has, opposite the supporting surface, what is called an upper surface that is intended to transmit the luminescent light radiation, and lateral flanks that extend from the upper surface as far as the supporting surface and thus bound the pad laterally.

The binding matrix of the photoluminescent pads is here a photoresist. By photoresist, what is meant here is a material the solubility of which in a developer changes under the effect of given light radiation that is applied thereto, here in the context of a photolithography step. It may be chosen from positive or negative resists, these categories of photoresist being known to those skilled in the art. Each photoluminescent pad is formed from a photoresist, which may be identical or different from one pad to the next, including the photoluminescent particles.

The photoresist is transparent and optically inert to the light radiation emitted by the light-emitting diodes and by the photoluminescent particles. Thus, the resist transmits at least 50% and preferably at least 80% of the light emitted by the light-emitting diodes and of the light emitted by the photoluminescent particles, and it does not emit light in response to an absorption of this light. It may be chosen from silicone, a polysiloxane such as polydimethylsiloxane (PDMS), the resist SU-8, thermoplastic polymers such as polymethyl methacrylate (PMMA), polyimide or from other suitable photoresists.

The photoluminescent particles are particles of at least one photoluminescent material suitable for at least partially converting the excitation light into luminescent light of longer wavelength. By way of example, they may be suitable for absorbing blue light, i.e. light the wavelength of which is comprised between about 440 nm and 490 nm, and for emitting in the green, i.e. at a wavelength comprised between about 495 nm and 560 nm, or even in the red, i.e. at a wavelength comprised between 600 nm and 650 nm. By wavelength, what is meant here is the wavelength of the intensity peak of the emission spectrum. By way of purely illustrative example, the light-emitting diodes may have an emission spectrum the intensity peak of which is located between 380 nm and 490 nm.

The photoluminescent particles are separated from one another and may be of any shape, for example spherical, angular, applanate, elongate or of any other shape. The size of a particle is here the smallest dimension of the particle, and the average size is the arithmetic mean of the sizes of the particles. The photoluminescent particles may have an average size comprised between 0.2 nm and 1000 nm, for example lower than 500 nm, for example lower than 100 nm, and preferably lower than 50 nm.

Preferably, the photoluminescent particles take the form of quantum dots, i.e. the form of semiconductor nanocrystals the quantum confinement of which is substantially three-dimensional. The average size of the quantum dots may then be comprised between 0.2 nm and 50 nm and for example between 1 nm and 30 nm. The quantum dots may be formed from at least one semiconductor compound, which may be chosen from cadmium selenide (CdSe), indium phosphide (InP), indium gallium phosphide (InGaP), cadmium sulphide (CdS), zinc sulphide (ZnS), cadmium oxide (CdO) or zinc oxide (ZnO), cadmium zinc selenide (CdZnSe), zinc selenide (ZnSe) for example doped with copper or manganese, graphene or from other suitable semiconductors. The quantum dots may also have a core/shell structure, the core/shell being made of material combinations such as CdSe/ZnS, CdSe/CdS, CdSe/CdS/ZnS, PbSe/PbS, CdTe/CdSe, CdSe/ZnTe, InP/ZnS, etc. The size and/or the composition of the photoluminescent particles are/is chosen depending on the wavelength desired for the luminescence.

The photoluminescent pads each take the form of a block of photoresist, the thickness of which is defined as being its largest dimension along an axis orthogonal to the surface on which it rests. The cross section of the pads, in a plane parallel to said surface on which they rest, may be various shapes and for example circular, oval, polygonal and for example triangular, square, rectangular or even hexagonal. Here, the width of a pad is defined as being a transverse dimension of a cross section of the pad. The local width is the width of the pad at a given height thereof. The average width is the mean (for example the arithmetic mean) of the local widths over the thickness of the pad.

The thickness of a photoluminescent pad may be comprised between 0.1 µm and 50 µm, is preferably comprised between 1 µm and 30 µm and is for example equal to about 20 µm. The width of a photoluminescent pad depends on that of a luminous pixel and therefore on the application of the optoelectronic device. It may be comprised between 0.5 µm and 1 µm, for example comprised between 1 µm and 20 µm and for example equal to about 1 µm in the case of a display screen or a projecting system. Moreover, the fraction per unit weight of photoluminescent particles in the photoresist may be comprised between 10% and 70%, is preferably comprised between 25% and 60% and is for example equal to 30%. It is adapted especially depending on the thickness of the photoluminescent pad so as to allow all of the thickness of the photoresist to be exposed in a photolithography step, and on the desired light conversion efficiency.

FIGS. 1A to 1F illustrate a method for manufacturing an optoelectronic device including light-emitting diodes according to a first embodiment.

A direct three-dimensional coordinate system (X,Y,Z) in which the plane (X,Y) is substantially parallel to the main plane of an optoelectronic chip 2, and in which the Z-axis is oriented in a direction orthogonal to the XY-plane, is defined here and will be referred to in the rest of the description.

FIG. 1A illustrates the provision of a matrix array of light-emitting diodes having a transmission surface 3 and the deposition of a first photoresist $5_1$ including first photoluminescent particles.

The matrix array of light-emitting diodes (not shown) is here formed in an optoelectronic chip 2 and defines a matrix array of luminous pixels P. One surface of the optoelectronic chip 2 forms the transmission surface 3 of the matrix array of light-emitting diodes. The transmission surface 3 is here substantially planar, though microstructures allowing light extraction to be improved may optionally be present therein.

The light-emitting diodes are here based on one and the same semiconductor compound, for example a III-V compound such as GaN. By based on, what is meant is that the light-emitting diodes are mainly made of said semiconductor compound. As detailed below, each light-emitting diode includes a stack of a first and a second doped semiconductor section, between which sections an active region is located. The active region is the region of a light-emitting diode in which light radiation is generated. The light-emitting diodes may have various structures, such as wire or mesa structures, examples of which are described below with reference to FIGS. 4B and 4C, and to FIG. 5, respectively. In this example, the light-emitting diodes are designed to emit blue light, i.e. light the emission spectrum of which has an intensity peak at a wavelength comprised between about 440 nm and 490 nm.

A first photoresist $5_1$ is deposited on the light-emitting diodes, here without making contact with the latter. More precisely, it is deposited on a supporting surface, here the transmission surface 3 of the optoelectronic chip 2, so as to be located facing the light-emitting diodes. The first photoresist $5_1$ includes first photoluminescent particles, here quantum dots, that are suitable for at least partially converting the blue light emitted by the light-emitting diodes into red light, green light or light of another colour and here, for example, red light. The photoresist $5_1$ may be deposited so as to completely cover the transmission surface 3. It may be deposited using a conventional technique known to those skilled in the art, for example spin coating, spray coating, rotogravure printing, screen printing, etc.

The photoresist $5_1$ has a substantially constant local thickness everywhere on the transmission surface 3, and has an average thickness that is preferably comprised between 0.1 µm and 50 µm, preferably comprised between 1 µm and 40 µm and for example equal to about 20 µm.

In this example, it includes photoluminescent particles, here quantum dots, that are suitable for at least partially converting the blue light emitted by the light-emitting diodes into red light. By way of example, quantum dots formed from CdSe semiconductor nanocrystals the average size of which is comprised between about 3 nm and 12 nm are suitable for converting blue light into red light. The first photoresist $5_1$ contains a fraction per unit weight of quantum dots that may be comprised between 10% and 70%, that is preferably comprised between 25% and 60% and that is for example equal to about 30%.

FIG. 1B illustrates a step of forming first photoluminescent pads $6_1$ by photolithography from the first photoresist $5_1$. The first pads $6_1$ are separated from one another and are positioned on the transmission surface 3 of pixels $P_R$ intended to emit red light.

In this example, all the first photoluminescent pads $6_1$ have substantially identical dimensions to one another. They are here formed from a block of first photoresist $5_1$ having a substantially square or rectangular cross section in the XY-plane. Each first photoluminescent pad $6_1$ thus has what is called an upper surface $7_1$ opposite the transmission surface 3, and lateral flanks 8, that extend from the upper surface $7_1$ as far as the transmission surface 3. In other words, the light-emitting diodes rest on a supporting layer (not shown) of the optoelectronic chip, and the upper surface of the photoluminescent pads is that surface of the pads which is opposite the supporting layer along the Z-axis. The thickness of the first pads $6_1$ is here substantially equal to 20 µm and their average width is substantially equal to the size of a pixel, which here is for example equal to about to 10 µm.

FIG. 1C illustrates a step of depositing a second photoresist $5_2$ on the transmission surface 3. This photoresist may be deposited using one of the aforementioned techniques, so as to cover the transmission surface 3 not coated with the first photoluminescent pads $6_1$. It thus makes contact with the lateral flanks $8_1$ of the first photoluminescent pads $6_1$. In this example, it has a thickness substantially equal to that of the first photoluminescent pads $6_1$ but may have a different thickness, for example a larger thickness.

In this example, the second photoresist $5_2$ includes second photoluminescent particles, here quantum dots, that are suitable for at least partially converting the blue light emitted by the light-emitting diodes into light different from that emitted by the first photoluminescent particles and here, for example, green light. By way of example, quantum dots formed from CdSe semiconductor nanocrystals the average size of which is equal to about 1.3 nm are suitable for converting blue light into green light. The second photoresist $5_2$ may contain a fraction per unit weight of quantum dots that is identical or different from that of the first photoresist $5_1$. Although the second photoluminescent particles are different from the first photoluminescent particles, the binding matrix forming the second photoresist $5_2$ may be identical to that forming the first photoresist $5_1$.

FIG. 1D illustrates a step of forming second photoluminescent pads $6_2$ by photolithography from the second photoresist $5_2$. The second pads $6_2$ are separated from one another and are also separate from the first pads $6_1$ insofar as they do not make contact with one another. They are positioned on the transmission surface 3 of pixels $P_G$ intended to emit green light.

The second photoluminescent pads $6_2$ may have dimensions that are identical or different from one second pad $6_2$ to the next, and that are identical or different from those of the first pads $6_1$. In this example, all the various pads $6_1$, $6_2$ have substantially identical dimensions to one another. The second photoluminescent pads $6_2$ are thus formed from a block of second photoresist $5_2$ having a substantially square or rectangular cross section in the XY-plane. Similar to the first pads, each second photoluminescent pad $6_2$ has what is called an upper surface $7_2$ opposite the transmission surface 3, and lateral flanks $8_2$ that extend from the upper surface $7_2$ as far as the transmission surface 3.

The minimal distance, in the XY-plane, separating each photoluminescent pad $6_1$, $6_2$ from the neighbouring pads $6_1$, $6_2$ is adapted to allow reflective walls $10_1$, $10_2$ to be formed covering the lateral flanks $8_1$, $8_2$ of the photoluminescent pads $6_1$, $6_2$. This distance may thus be of the order of a few hundred nanometres to a few microns or indeed more.

In this example, the transmission surface 3 includes zones that are not coated with photoluminescent pads $6_1$, $6_2$, which zones are located facing one or more light-emitting diodes, thus defining luminous pixels $P_B$ intended to emit blue light. These pixels $P_B$ may have a size substantially equal to those of the luminous pixels $P_G$, $P_R$ including photoluminescent pads $6_1$, $6_2$. As a variant, the zones intended to form blue pixels may include photoluminescent pads the photoluminescent particles of which are suitable for emitting blue light of wavelength different from that of the blue light emitted by the diodes.

By way of example, the diodes may emit at a wavelength of about 450 nm and the photoluminescent particles may emit at a wavelength of about 480 nm.

FIG. 1E illustrates a step of conformally depositing a thin layer 9 made of at least one reflective material and for example of at least one metal. The thin layer 9 may thus be deposited by chemical vapour deposition (by atomic layer deposition for example) or even by physical vapour deposition (by electron-beam physical vapour deposition or cathode sputtering for example), etc. By conformal deposition, what is meant is that the thin layer is deposited on the photoluminescent pads 6 in such a way that it extends locally substantially parallel to the surface that it covers. The conformally deposited thin layer has a substantially uniform thickness. Its local thickness may however vary between a minimum value, for example at a surface that is substantially orthogonal to the XY-plane, and a maximum value, for example at a surface substantially parallel to the XY-plane. By way of purely illustrative example, for a thin layer conformally deposited with a thickness of 200 nm, the thickness of the layer may vary between a value of 100 nm on the lateral flanks 8 of the pads 6 and a value of 200 nm on the transmission surface 3 and the upper surfaces 7 of the pads 6.

The thin layer 9 may be formed from just one reflective material or from a plurality of various materials deposited on one another. The reflective materials may be chosen from aluminium, silver, platinum or any other suitable material. The thin layer 9 has a substantially uniform average thickness, which may be comprised between to nm and 500 nm and preferably between 50 nm and 300 nm and which is for example equal to about too nm on the lateral flanks 8 of the pads 6.

The thin layer 9 covers the various photoluminescent pads $6_1$, $6_2$ and the transmission surface 3 not coated with the pads $6_1$, $6_2$. Thus, it continuously covers the lateral flanks $8_1$, $8_2$ and the upper surfaces $7_1$, $7_2$ of the first and second photoluminescent pads $6_1$, $6_2$, and the transmission surface 3 located between two adjacent luminous pixels including photoluminescent blocks, i.e. here the green pixels $P_G$ and red pixels $P_R$, and at the luminous pixels that do not include a photoluminescent pad, i.e. here the blue pixels $P_B$.

FIG. 1F illustrates a step of forming reflective walls $10_1$, $10_2$ covering the lateral flanks $8_1$, $8_2$ of the photoluminescent pads $6_1$, $6_2$ by etching the thin layer 9 locally.

Thus, those portions of the thin reflective layer 9 that are not located in contact with the lateral flanks $8_1$, $8_2$ of the photoluminescent pads $6_1$, $6_2$ are etched. Thus, the portions of the thin layer 9 that cover the upper surfaces $7_1$, $7_2$ of the photoluminescent pads $6_1$, $6_2$ are removed, and the portions of the thin layer 9 that cover the zones of the transmission surface 3 defining the blue pixels $P_B$ are also removed. Thus, the upper surfaces $7_1$, $7_2$ and the transmission surface 3 covered by the thin layer 9 are freed. By free, what is meant is that the surfaces are not covered by a layer. Those portions of the thin layer 9 which are located on the transmission surface 3 between two adjacent luminous pixels $P_G$, $P_R$ including photoluminescent blocks are also removed. Thus, the lateral flanks 8 of the pads 6 are covered by the reflective walls 10. In other words, the reflective walls to rest on the lateral flanks and continually cover them while making contact therewith.

This etching step may be a step of dry etching and for example a step of plasma etching (RIE, ICP, etc.). Since dry etching is highly anisotropic, only the portions of the thin reflective layer 9 covering the lateral flanks $8_1$, $8_2$ of the photoluminescent pads $6_1$, $6_2$ remain, thus forming reflective walls $10_1$, $10_2$ that encircle the photoluminescent pads $6_1$, $6_2$ in a plane parallel to the XY-plane.

The layer of the transmission surface 3 may act as an etch stop for the dry etching of the metal, thus allowing the integrity of the light-emitting diodes to be preserved. It may thus be a face of a planarisation layer made of an organic or mineral material, or even a passivation layer made of a dielectric material, for example silicon oxide (for example $SiO_2$), silicon nitride (for example $Si_3N_4$), or silicon oxynitride (SiON).

Thus, the manufacturing method according to this first embodiment allows an optoelectronic device having a high resolution and a high contrast to be obtained. Specifically, using a photoresist containing photoluminescent particles and advantageously quantum dots, it is possible to form the photoluminescent pads directly by photolithography. Thus, it is possible to obtain a matrix array of photoluminescent pads of high resolution, while avoiding recourse to alternative techniques such as localised deposition of droplets containing photoluminescent particles. Such techniques have drawbacks especially related to the control of the size of the droplets, the alignment of the droplet-dispensing head with respect to the luminous pixels, etc. which may prevent the desired resolution from being obtained. In addition, the formation of reflective walls by conformal deposition then local etching allows a high contrast to be obtained insofar as the light radiation associated with a pixel cannot reach the photoluminescent block of a neighbouring pixel.

FIGS. 2A to 2H illustrate a method for manufacturing an optoelectronic device 1 comprising light-emitting diodes according to a second embodiment.

FIG. 2A illustrates a step of providing a matrix array of light-emitting diodes and a step of depositing of a first photoresist $5_1$ including first photoluminescent particles. The steps are identical or similar to those described with reference to FIG. iA and are not described in greater detail.

FIG. 2B illustrates a step of forming first photoluminescent pads $6_1$ by photolithography from the first photoresist $5_1$. This step is also similar or identical to that described with reference to FIG. 1B.

FIG. 2C illustrates a step of conformally depositing a first thin layer $9_1$ made of at least one reflective material. In contrast to the first embodiment, the first thin reflective layer 9, is deposited before the second photoluminescent pads $6_2$ have been formed.

The first thin layer 9, may thus be deposited by one of the aforementioned techniques. It may be formed from one and only one reflective material or from a plurality of various materials deposited on one another, and have a substantially constant thickness, for example equal to about 100 nm.

It covers the first photoluminescent pads $6_1$ and the transmission surface 3 not coated with the first pads $6_1$. Thus, it continuously covers the lateral flanks $8_1$ and the upper surface $7_1$ of the first photoluminescent pads $6_1$, and those zones of the transmission surface 3 which are intended to form the other luminous pixels, i.e. here the green pixels $P_G$ and blue pixels $P_B$.

FIG. 2D illustrates a step of forming, by local etching of the first thin layer $9_1$, the first reflective walls $10_1$ covering the lateral flanks $8_1$ of the first photoluminescent pads $6_1$.

Thus, those portions of the thin layer $9_1$ that are not located in contact with the lateral flanks $8_1$ of the first photoluminescent pads $6_1$ are etched. Thus, the portions of the thin layer 9 that cover the upper surfaces $7_1$ of the first photoluminescent pads $6_1$ are removed, and the portions that cover the zones of the transmission surface 3 defining the green pixels $P_G$ and blue pixels $P_B$ are also removed.

This etching step may be a step of dry etching and for example a step in which one of the aforementioned techniques is implemented. Since dry etching is highly anisotropic, only the portions of the first thin layer $9_1$ covering the lateral flanks $8_1$ of the first photoluminescent pads $6_1$ remain, thus forming the first reflective walls $10_1$ that encircle the first photoluminescent pads $6_1$, in a plane parallel to the XY-plane.

FIG. 2E illustrates a step of depositing a second photoresist $5_2$ on the transmission surface 3. It may be deposited using one of the aforementioned techniques so as to cover the transmission surface 3 not coated with the first photoluminescent pads $6_1$. It thus makes contact with the reflective walls $10_1$ of the first pads $6_1$, and, in this example, has a thickness that is substantially equal to that of the first photoluminescent pads $6_1$. The second photoresist $5_2$ includes second photoluminescent particles, here quantum dots, that are similar or identical to those described in the first embodiment.

FIG. 2F illustrates a step of forming second photoluminescent pads $6_2$ by photolithography from the second photoresist $5_2$. In this example, they are positioned on the transmission surface 3 of pixels $P_G$ intended to emit green light.

In contrast to the first embodiment, at least one second photoluminescent pad $6_2$, and here each second photoluminescent pad $6_2$, is located against a first photoluminescent pad $6_1$ so as to make contact with the corresponding first reflective wall $10_1$. Here said pad makes contact with at least one first reflective wall $10$, but also includes at least one free lateral-flank portion $8_2$, i.e. a portion that does not make contact with a first reflective wall $10_1$.

The second photoluminescent pads $6_2$ are separated from one another and are also separated from the first photoluminescent pads $6_1$. Each second pad $6_2$ is moreover optically and structurally separated from the first pad $6_1$ against which it is located by the first reflective wall $10_1$. Thus, the photoluminescent light radiation emitted by the first photoluminescent particles cannot be transmitted to the adjacent second photoluminescent pad $6_2$, nor that of the second photoluminescent particles transmitted to the adjacent first photoluminescent pad $6_1$.

FIG. 2G illustrates a step of depositing a second thin layer $9_2$ made of a reflective material. The second thin layer $9_2$ may be formed from one or more materials that are identical to that or those of the first thin layer $9_1$. Preferably, the second thin layer $9_2$ is identical, in terms of material and thickness, to the first thin layer $9_1$.

The second thin layer $9_2$ is deposited so as to cover the first and second photoluminescent pads $6_1$, $6_2$ and the transmission surface 3 not coated with the photoluminescent pads $6_1$, $6_2$. Thus, it continuously covers the upper surfaces $7_1$, $7_2$ of the first and second photoluminescent pads $6_1$, $6_2$, the lateral flanks $8_2$ of the second photoluminescent pads $6_2$, and the first reflective wall $10_1$ of the first photoluminescent pads $6_1$. It also covers those zones of the transmission surface 3 which are intended to form the blue pixels $P_B$.

Figure 2H:
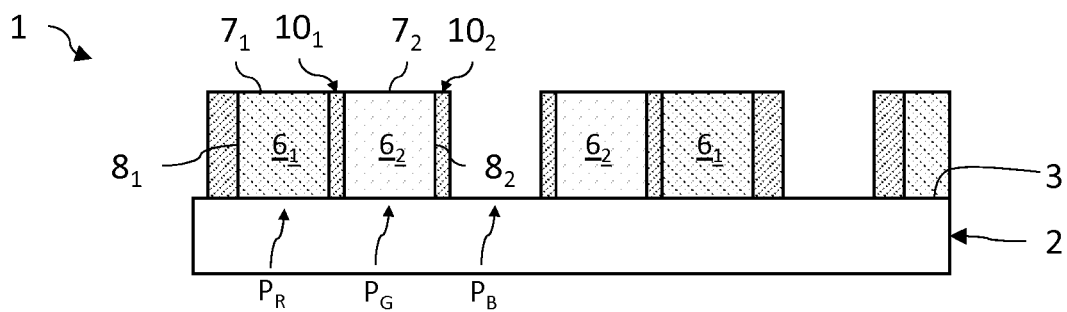

FIG. 2H illustrates a step of forming, by local etching of the second thin layer $9_2$, second reflective walls $10_2$ covering the lateral flanks $8_2$ of the second photoluminescent pads $6_2$ that do not make contact with a first reflective wall $10_1$. Thus, those portions of the second thin layer $9_2$ that are not located in contact with the lateral flanks $8_2$ of the second photoluminescent pads $6_2$ are etched. Thus, the portions of the thin layer $9_2$ that cover the upper surfaces $7_1$, $7_2$ of the first and second photoluminescent pads $6_1$, $6_2$ are removed, and the portions that cover the zones of the transmission surface 3 defining the blue pixels $P_B$ are also removed.

This etching step may be a step of dry etching and for example a step in which one of the aforementioned techniques is implemented. Since dry etching is highly anisotropic, only the portions of the second thin layer $9_2$ covering the lateral flanks $8_2$ of the second photoluminescent pads $6_2$ remain, thus forming second reflective walls $10_1$. Whereas each first reflective wall $10$, continuously encircles, in a plane parallel to the XY-plane, the corresponding first photoluminescent pad $6_1$, each second reflective wall $10_2$ makes contact only with one portion of the lateral flanks $8_2$ of the corresponding second photoluminescent pad $6_2$. It may clearly be seen that one portion of the first reflective wall $10$, is covered by one portion of the second reflective wall $10_2$, this resulting in an increased local thickness of reflective material.

Thus, the method according to the second embodiment allows an optoelectronic device having an even higher resolution to be obtained, insofar as the first and second photoluminescent pads $6_1$, $6_2$ located next to each other are mutually separated only by a single reflective wall the thickness of which may be smaller than 500 nm and for example about equal to 100 nm or indeed less. It is thus possible to increase the resolution of the optoelectronic device, while maintaining a high contrast between the pixels.

Figure 3A:
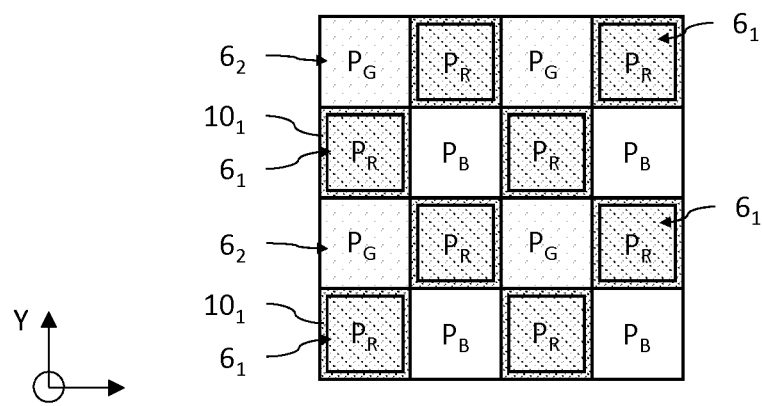
FIG. 3A is a schematic and partial view from above of one variant of the manufacturing method according to the second embodiment, in which the lateral flanks of each second photoluminescent pad make contact with first reflective walls (here it is an example of a Bayer matrix)

According to one variant illustrated in FIG. 3A, the luminous pixels are arranged so as to form a Bayer matrix, i.e. so as to form a geometric repetition of a set of a plurality of luminous pixels suitable for emitting at different wavelengths, for example two green pixels $P_G$, one red pixel $P_R$ and one blue pixel $P_B$, which pixels are arranged adjacently pairwise.

In this example, a given green pixel $P_G$ is adjacent to four different red pixels $P_R$. More precisely, a given second photoluminescent pad $6_2$ suitable for converting blue excitation light into green light, is bordered by four first photoluminescent pads $6_1$ that are separated from one another and suitable for converting the blue excitation light into red light. Each second pad $6_2$ thus makes contact with the first reflective walls $10_1$ of four adjacent first pads $6_1$.

Thus, this variant of the method according to the second embodiment does not include a step of forming second reflective walls $10_2$ covering the lateral flanks $8_2$ of the second pads $6_2$. Specifically, during the deposition of the second photoresist $5_2$, the latter fills the spaces formed between the first photoluminescent pads $6_1$ and more precisely the spaces formed between the mutually facing first reflective walls $10_1$. The second photoresist $5_2$ is then removed by photolithography from the zones intended to form blue luminous pixels $P_B$. The second photoluminescent pads $6_2$ thus formed therefore make contact with the reflective walls $10_1$ of a plurality of neighbouring first photoluminescent pads $6_1$. They are therefore bounded laterally, in the XY-plane, by the first reflective walls $10_1$.

Other arrangements of the luminous pixels are of course possible. Thus, in the example in FIG. 3B, along the X-axis, the first photoluminescent pads $6_1$ are spaced apart pairwise either by a second photoluminescent pad $6_2$ or by a zone of the transmission surface 3 that is intended to form a blue pixel $P_B$.

Figure 3B:
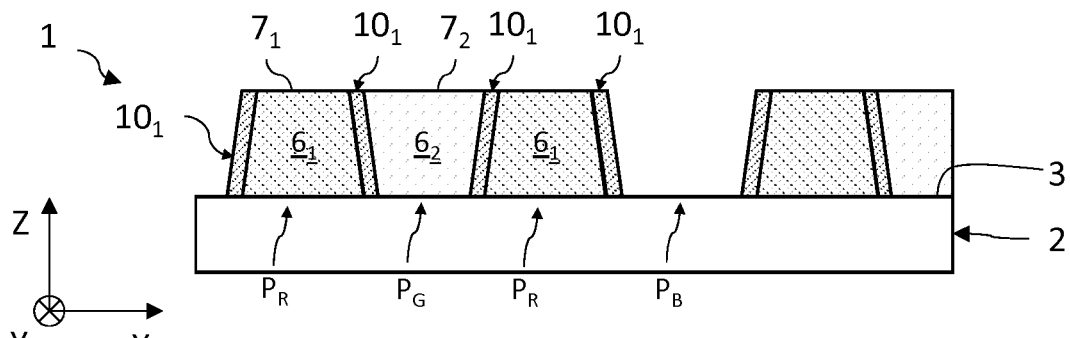
FIG. 3B is a schematic partial cross-sectional view of an optoelectronic device obtained using another variant of the manufacturing method according to the second embodiment, in which the reflective walls are inclined.

According to another variant illustrated in FIG. 3B, the reflective walls $1o$, are inclined with respect to the XY-plane. By inclined, what is meant is that the reflective walls $1o$, have an angle of inclination other than 90° to the XY-plane. This angle of inclination may thus be strictly smaller than 90° and larger than or equal to a maximum nonzero value of inclination that, for example, may be equal to about 20°. These walls are here substantially planar and have a substantially constant local angle of inclination. The first photoluminescent pads $6_1$, which are preferably suitable for converting the excitation light into the red, have a truncated pyramidal shape, i.e. the area occupied by the upper surface $7_1$ is smaller than that occupied by the base of the pad making contact with the transmission surface 3.

In contrast, the second photoluminescent pads $6_2$, which are preferably suitable for converting the excitation light into the green, have a flared shape, insofar as the area occupied by the upper surface $7_2$ is larger than that occupied by the base. They thus have an inverted truncated pyramidal shape. The fact that the second photoluminescent pads $6_2$ have a shape that is flared outwards allows the extraction of the luminescent light radiation to be improved. Specifically, reabsorption of the luminescent radiation by the same photoluminescent particles can thus be limited, this being particularly advantageous when the latter are suitable for emitting luminescent light in the green.

As a variant, the reflective walls $10_1$, $10_2$ need not be planar, but may have a curved shape, in particular when the first photoluminescent pads $6_1$ have substantially curved lateral flanks $8_1$. By curved, what is in particular meant is a surface that is devoid of planar zones, or that is formed from a succession of planar zones that are inclined pairwise. It is then possible to limit the partial etching of the reflective walls $10_1$, $10_2$ in the step of dry etching of the thin reflective layers $9_1$, $9_2$ while optimising the extraction of light and while limiting the reabsorption of the luminescent light of the second photoluminescent pads $6_2$.

Figure 4A:
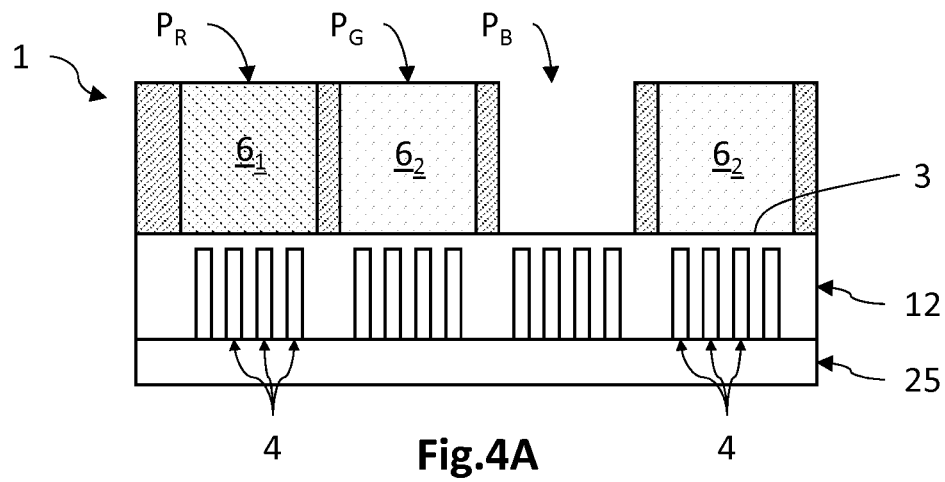
FIG. 4A is a schematic partial cross-sectional view of an optoelectronic device obtained by the manufacturing method according to the second embodiment, in which the light-emitting diodes are wire light-emitting diodes.
Figure 4B:
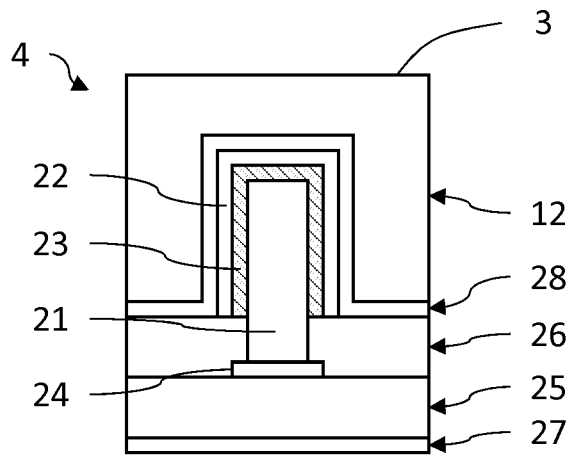
FIG. 4B illustrates in detail an exemplary wire light-emitting diode with a core/shell configuration.

Generally, the light-emitting diodes may have various types of structures. FIGS. 4A and 4B illustrate an example of wire-type light-emitting diodes 4, here in the configuration called the core-shell configuration.

With reference to FIG. 4A, the optoelectronic device includes an optoelectronic chip 2 in which the matrix array of light-emitting diodes 4 is located. Each luminous pixel thus includes a plurality of wire light-emitting diodes 4. The light-emitting diodes 4 may be uniformly distributed in each luminous pixel, and form sets of diodes that are electrically separate from one another. Thus, each set of diodes belongs to one luminous pixel, which may be activated independently of the other sets of diodes. In a given set, the light-emitting diodes 4 are connected in parallel, so as to emit simultaneously when the corresponding pixel is activated.

The light-emitting diodes 4 rest on a supporting layer 25, for example a growth substrate. In the case where the growth substrate 25 is electrically insulating, electrical lines (not shown) may be present in the interior of the substrate 25 in order to allow the various pixels of light-emitting diodes 4 to be biased. In the case of an electrically conductive growth substrate 25, for example one based on silicon, trench isolations (not shown) may be provided to electrically isolate the pixels from one another. Moreover, the supporting layer 25 may be fastened and electrically connected to a control chip (not shown) suitable for ensuring the electrical control of the optoelectronic device.

The light-emitting diodes 4 are coated with at least one spacer layer 12 the face of which opposite the supporting layer forms the transmission surface 3. The spacer layer 12 is transparent to the light radiation emitted by the light-emitting diodes 4. It may be formed by a passivation layer produced from a dielectric material, and optionally from a planarisation layer. The dielectric material may be chosen from an oxide, a nitride or even a silicon oxynitride. Other materials may also be suitable. The planarisation layer may be formed from an organic or mineral material such as silicone or PMMA. The spacer layer has a thickness larger than the longitudinal dimension, along the Z-axis, of the light-emitting diodes 4, so as to cover them uniformly.

FIG. 4A illustrates an exemplary light-emitting diode 4 belonging to a given luminous pixel, which diode is a wire diode in a core/shell configuration. The light-emitting diode 4 has an elongate three-dimensional shape and extends longitudinally along an axis parallel to the Z-axis. In this example, it includes a first doped section 21, which, for example, is n-doped, taking the form of a wire that extends longitudinally from a nucleation pad 24 that rests on a front side of a growth substrate 25. A growth mask 26 made of a dielectric material covers the front side of the substrate 25 and includes an aperture opening onto the nucleation pad 24. The nucleation pads 24 may be pads that are separated from one another, or even various zones of a given thin continuous layer. An upper portion of the first doped section 21 is covered, at its upper border and its lateral border, by one or more layers forming an active zone 23 that includes at least one quantum well. The active zone 23 is itself covered by a layer forming a second doped section 22 that here is p-doped. The light-emitting diodes 4 are here nanowires or microwires in a core/shell configuration, the doped section 21 and the doped section 22 forming the core and the shell of the wire, respectively.

The light-emitting diodes 4 of a given luminous pixel are here electrically connected in parallel. The back side of the substrate 25, which here is electrically conductive, is coated with a first biasing electrode 27, and the doped sections 22 are covered with a continuous layer forming a second biasing electrode 28. Lastly, the spacer layer 12 entirely covers the light-emitting diodes 4. Said layer has a here substantially planar upper face that forms the transmission surface 3 of the matrix array of light-emitting diodes 4.

Figure 4C:
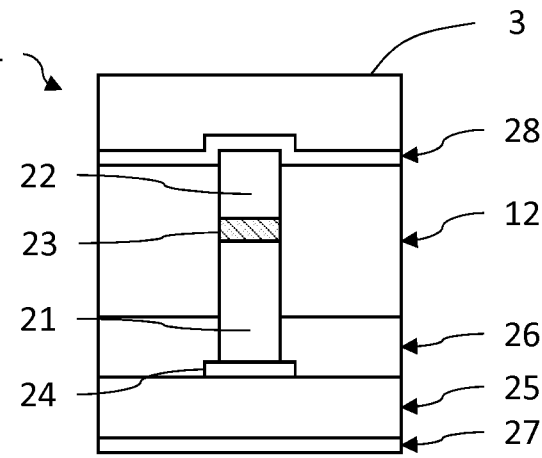
FIG. 4C illustrates another exemplary wire light-emitting diode with an axial configuration.

FIG. 4C illustrates another exemplary light-emitting diode 4 belonging to a given luminous pixel, which diode is a wire diode in an axial configuration. In this example, the wire is formed by a stack of the first doped section 21, of the active zone 23 and of the second doped section 22, which extends along a longitudinal axis parallel to the Z-axis. In contrast to the core/shell configuration, the active zone 23 covers substantially only the upper border of the doped section 21, and the doped section 22 covers substantially only the upper border of the active zone 23. As above, the wire extends longitudinally from a nucleation pad 24 that rests on a front side of a growth substrate 25. The growth mask 26 covers the front side of the substrate 25 and includes an aperture opening onto the nucleation pad 24. The spacer layer covers the lateral border of the wire, and is passed through by the second biasing electrode 28 that makes contact with the upper border of the second doped section 22. The spacer layer 12 has an upper face that forms the transmission surface 3.

Purely by way of illustration, the light-emitting diodes 4 may be based on GaN and be suitable for emitting excitation radiation in the blue. They may have transverse dimensions comprised between 10 nm and 10 µm and for example comprised between 100 nm and 5 µm. Their height is larger than their transverse dimensions and for example 2 times, 5 times, and preferably at least 10 times larger, and may be equal to about 10 µm.

Figure 5:
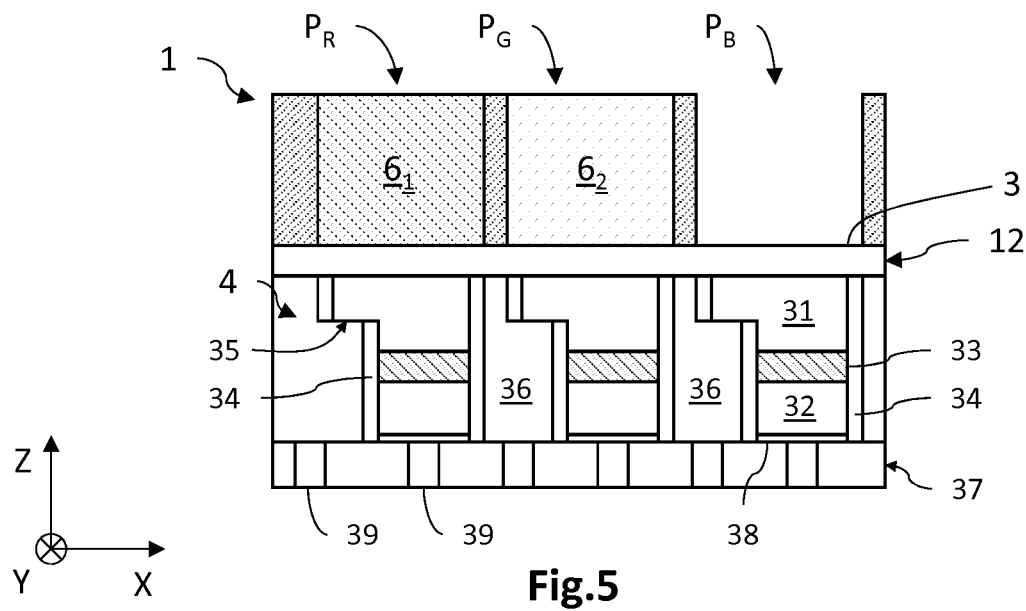
FIG. 5 is a schematic partial cross-sectional view of an optoelectronic device obtained by the manufacturing method according to the second embodiment, in which the light-emitting diodes are mesa diodes.

FIG. 5 illustrates an optoelectronic device in which the light-emitting diodes 4 have a mesa structure. In this example, each luminous pixel includes a single light-emitting diode 4 that may be activated independently of the other diodes 4.

The light-emitting diodes 4 are each formed by a stack of a first doped section 31, here of n type, and of a second doped section 32, here of p type, between which sections an active zone 33 is located. They form mesa structures that are substantially coplanar with one another. This structure of the light-emitting diodes 4 is similar or identical to that described in document EP2960940, the text of which is considered to be integrally incorporated into the present description. By mesa structure, what is meant is a structure formed from a stack of semiconductor sections 31, 32, 33 that protrude above a growth substrate following an etching step. The mesa structures are substantially coplanar in so far as the first doped sections 31 of the light-emitting diodes 4 are respectively coplanar. The same goes for the active zones 33 and the second doped sections 32.

Each light-emitting diode 4 has a first doped section 31 a surface of which opposite the active zone 33 is a surface via which the light radiation of the diode 4 is emitted. The lateral flanks of the first doped section 31 and of the second doped section 32, and those of the active zone 33, are covered with a dielectric layer 34, except for at a breakout surface 35 of the first doped section 31.

The light-emitting diodes 4 are separated from one another by lateral electrical connection components 36 that extend along the Z-axis between the diodes. Each light-emitting diode 4 is thus associated with a lateral connection component 36 that makes electrical contact with the breakout surface 35 of the first doped section 31, allowing a determined electrical potential to be applied to the first doped section 31. This lateral connection component 36 is however electrically insulated from the adjacent diodes 4 by the dielectric layers 34 thereof.

The optoelectronic chip 2 in this example includes a layer 37 called an electrically connecting layer that forms a supporting layer, the layer 37 allowing electrical contact between the control chip (not shown) and i) the lateral electrical connection components 36, and ii) electrical connection sections 38 located in contact with the second doped sections 32. The connecting layer 37 thus includes connection pads 39 that are electrically insulated from one another by a dielectric material. Thus, the control chip may apply an electrical potential to any one of the light-emitting diodes 4, and thus activate them independently of one another.

The spacer layer 12 here includes a passivation layer made of a dielectric material covering the lateral connection components 36 and the emission face of the first doped sections 31 of the light-emitting diodes 4, said spacer layer optionally being completed with a planarisation layer. The face of the spacer layer 12 that is opposite the light-emitting diodes 4 forms the transmission surface 3 of the diode matrix array.

Purely by way of illustration, the light-emitting diodes 4 may be based on GaN and be suitable for emitting light radiation in the blue. They may have a thickness comprised between too nm and 50 µm, and their lateral dimensions may be comprised between 500 nm and a few hundred microns, and preferably are smaller than 50 µm, preferably smaller than 30 µm, and may be equal to 10 µm or even 5 µm.

As a variant to the first and second embodiments, in which embodiments the photoluminescent pads 6 are produced directly on an emission surface 3 of a matrix array of light-emitting diodes, the steps of forming the photoluminescent pads 6 and the reflective walls 10 may be carried out on what is referred to as a supporting surface of a plate that is transparent to the light radiation emitted by the light-emitting diodes, the transparent plate then being added and fastened to the matrix array of light-emitting diodes and for example to the spacer layer. The method according to this variant is then similar to those of the first and second embodiments described above, the emission surface 3 then being a surface of the transparent plate. The transparent plate may be produced from glass and especially a borosilicate glass such as Pyrex, or from sapphire, or from any other suitable material. It has a thickness permitting it to be handled and therefore added to the diodes. The transparent plate may be fastened to the matrix array of light-emitting diodes and for example to the aforementioned spacer layer by any means, for example by adhesive bonding using an adhesive that is transparent to the light radiation emitted by the diodes. After the step of adding the transparent plate to the matrix array of light-emitting diodes, the photoluminescent pads are each located facing at least one light-emitting diode.

FIGS. 6A to 6I illustrate a method for manufacturing an optoelectronic device 1 comprising light-emitting diodes according to a third embodiment, which embodiment differs from the first and second embodiments essentially in that the diodes are wire diodes and located inside photoresist pads, certain or all of which are photoluminescent. By located inside, what is meant is that the photoresist pad encircles each of the corresponding light-emitting diodes in the XY-plane and covers them along the Z-axis. The light-emitting diodes therefore make contact with the photoresist of the pad and are not spaced apart therefrom by the spacer layer as in the first and second embodiments.

Figure 6A:
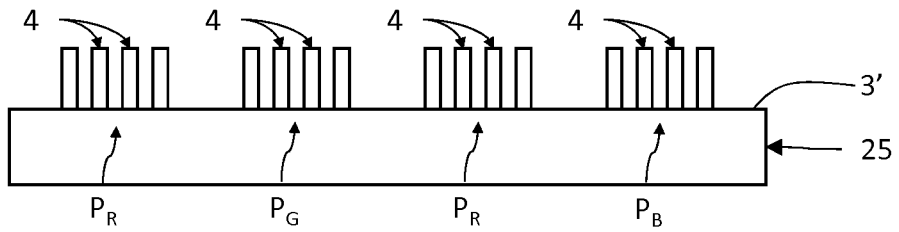
FIGS. 6A to 6I are schematic partial cross-sectional views of various steps of a manufacturing method according to a third embodiment, in which the light-emitting diodes are located inside the photoresist pads.

FIG. 6A illustrates a step of providing a matrix array of wire light-emitting diodes that preferably have a core/shell configuration. The light-emitting diodes 4 here have a structure that is identical or similar to that shown in FIG. 4B, with the exception of the spacer layer 12. They thus take the form of an elongate three-dimensional structure that extends along a longitudinal axis parallel to the Z-axis from the surface of a supporting layer, for example the growth substrate 25.

The light-emitting diodes 4 are arranged on the supporting layer 25 in sets of light-emitting diodes, which sets are intended to form luminous pixels of various emission colours, for example here blue pixels $P_B$, red pixels $P_R$ and green pixels $P_G$. Thus, preferably, the diodes of a given set, and therefore of a given luminous pixel, are electrically connected in parallel, and each set of diodes is electrically independent of the other sets. By way of illustration, the light-emitting diodes 4 may have a height equal to about 10 µm. In this example, they are based on GaN and are suitable for emitting blue excitation light.

Figure 6B:
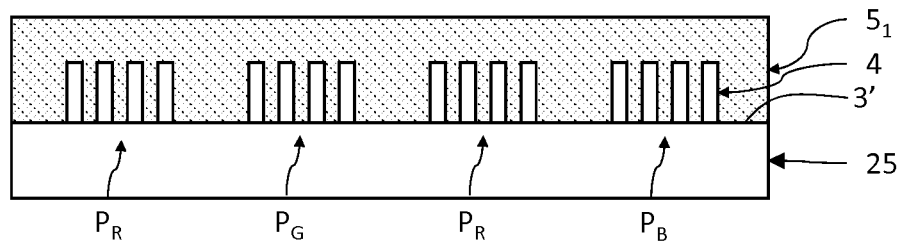

FIG. 6B illustrates a step of depositing on a supporting surface 3', here the surface of the supporting layer 25, a first photoresist $5_1$ including first photoluminescent particles. The photoresist $5_1$ makes contact with and covers the surface 3' of the supporting layer 25, and makes contact with and covers each light-emitting diode 4 on its emission surface. It thus extends, in a plane parallel to the XY-plane, between each of the light-emitting diodes 4, and has a thickness larger than the height of the light-emitting diodes 4. By way of illustration, the first photoresist $5_1$ may have a thickness equal to about 20 µm. The first photoluminescent particles may here be suitable for converting into red light the blue excitation light emitted by the light-emitting diodes 4. They are here quantum dots, the average size of which is smaller than 50 nm.

Figure 6C:
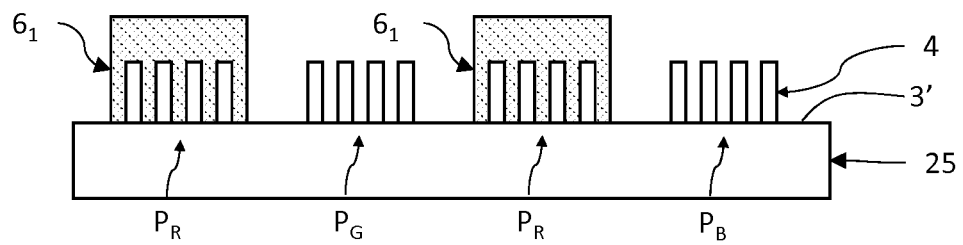

FIG. 6C illustrates a step of forming first photoluminescent pads $6_1$ by photolithography from the first photoresist $5_1$. The first photoluminescent pads $6_1$ are localised inside the zones intended to form red luminous pixels $P_R$. Thus, each first pad $6_1$ covers and extends between the light-emitting diodes 4 of the corresponding pixel $P_R$. In other words, the diodes 4 of the pixels $P_R$ are located inside the first pads $6_1$, and are not located a distance away therefrom as in the first and second embodiments described above. By way of illustration, the first pads $6_1$ have a thickness substantially equal to 20 µm and a width substantially equal to 10 µm. The first photoluminescent pads $6_1$ have a width such that each first pad $6_1$ extends on the corresponding luminous pixel $P_R$, and does not extend over the zones intended to form the neighbouring luminous pixels $P_B$ and $P_G$ of other colours. The zones intended to form luminous pixels of other colours, for example here the blue pixels $P_B$ and green pixels $P_G$, do not include first photoluminescent pads $6_1$.

Figure 6D:
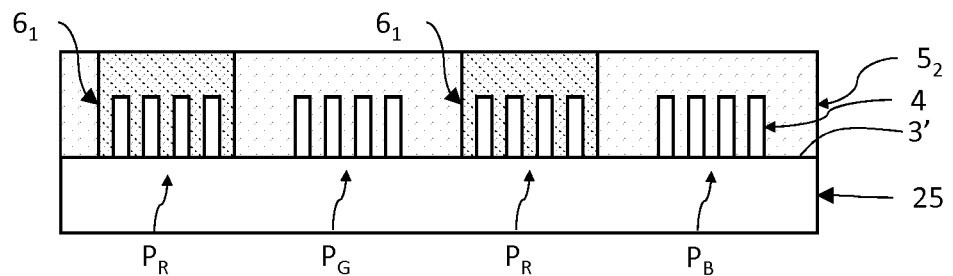

FIG. 6D illustrates a step of depositing a second photoresist $5_2$ including second photoluminescent particles. The latter are different from the first photoluminescent particles insofar as their emission spectrum is different from that of the first photoluminescent particles. In this example, they are suitable for converting into green light the blue excitation light emitted by the light-emitting diodes 4. They are here quantum dots, the average size of which is smaller than 50 nm. The second resist $5_2$ makes contact with and covers the surface 3' of the supporting layer 25, and makes contact with and covers each light-emitting diode 4 not located in the first pads $6_1$. It thus extends, in a plane parallel to the XY-plane, between the light-emitting diodes 4 located inside the zones intended to form the blue luminous pixels $P_B$ and the green luminous pixels $P_G$, and has a thickness larger than the height of the light-emitting diodes 4. By way of illustration, the second photoresist $5_2$ may have a thickness substantially equal to about 20 µm.

Figure 6E:
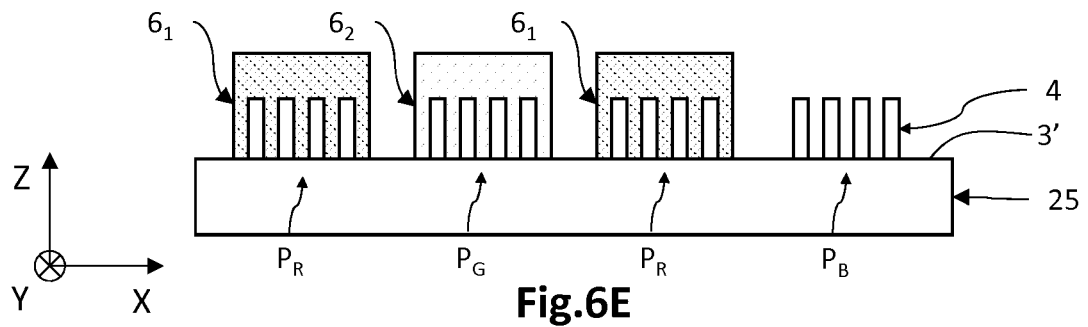

FIG. 6E illustrates a step of forming second photoluminescent pads $6_2$ by photolithography from the second photoresist $5_2$. The second pads $6_2$ are localised in the zones intended to form green luminous pixels $P_G$. Each second pad $6_2$ thus covers the light-emitting diodes 4 of the corresponding pixel $P_G$, and extends between the diodes 4 while making contact therewith. In other words, the diodes 4 of the pixels $P_G$ are located inside the second pads $6_2$. By way of illustration, the second pads $6_2$ have a thickness substantially equal to 20 µm and a width substantially equal to 10 µm. The second pads $6_2$ have a width such that each second pad $6_2$ extends in the corresponding luminous pixel $P_G$, and does not extend over the zones intended to form the neighbouring blue luminous pixels $P_B$. The zones intended to form blue luminous pixels $P_B$ do not include second photoluminescent pads $6_2$.

Figure 6F:
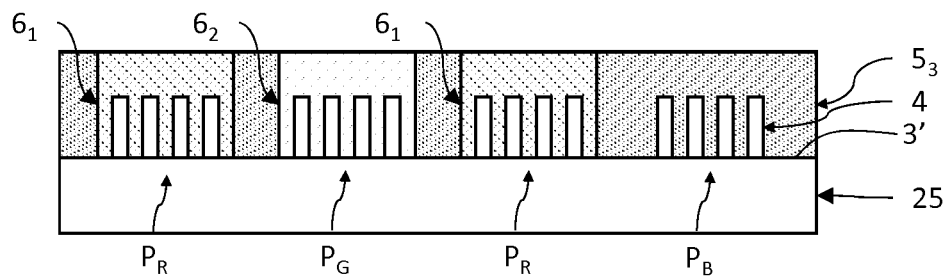

FIG. 6F illustrates a step of depositing a third photoresist $5_3$ so that it covers the diodes located in zones intended to form blue pixels $P_B$. It makes contact with and covers the surface 3' of the supporting layer 25. The third photoresist $5_3$ may or may not include third photoluminescent particles that are different from the first and second photoluminescent particles. In the case where it does not include photoluminescent particles, the luminous pixel $P_B$ is suitable for emitting light the spectrum of which corresponds to that of the light-emitting diodes. In this example, it includes third photoluminescent particles, here quantum dots the average size of which is smaller than 50 nm, suitable for converting the blue excitation light emitted by the light-emitting diodes 4 into blue light of another wavelength. By way of example, the diodes may emit at a wavelength of about 450 nm and the third particles may be suitable for emitting luminescent light at about 480 nm. The third resist $5_3$ makes contact with and covers the surface of the supporting layer, and makes contact with and covers each diode 4 not located in the first and second pads $6_1$ and $6_2$. It thus extends, in a plane parallel to the XY-plane, between the light-emitting diodes 4 located in the zones intended to form blue luminous pixels $P_B$, and has a thickness larger than the height of the light-emitting diodes 4. By way of illustration, the third photoresist $5_3$ may have a thickness substantially equal to about 20 µm.

Figure 6G:
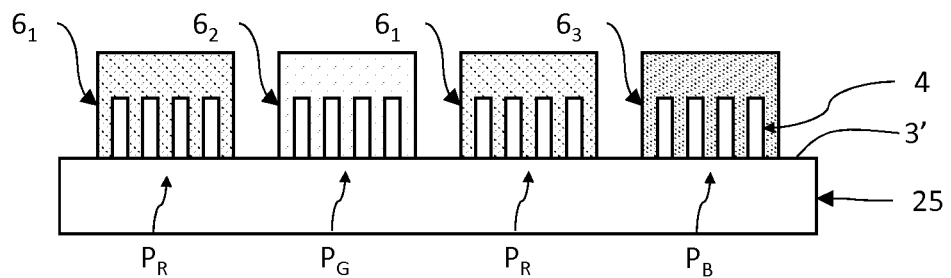

FIG. 6G illustrates a step of forming third pads $6_3$, here photoluminescent pads, by photolithography from the third photoresist $5_3$. The third pads $6_3$ are localised in zones intended to form blue luminous pixels $P_B$. Each third pad $6_3$ covers and extends between the diodes 4 of the corresponding pixel $P_B$, while making contact therewith. In other words, the diodes 4 of the pixels $P_B$ are located inside the third pads $6_3$. By way of illustration, the third pads $6_3$ have a thickness substantially equal to 20 µm and a width substantially equal to 10 µm. The third pads $6_3$ have a width such that each third pad $6_3$ extends in the corresponding blue luminous pixel $P_B$.

Figure 6H:
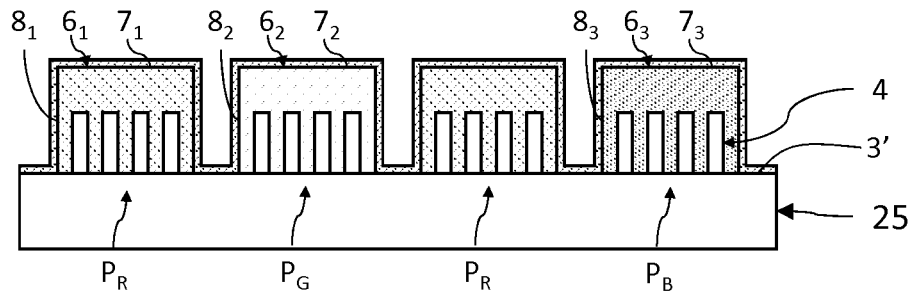

FIG. 6H illustrates a step of conformally depositing a thin layer 9 made of at least one reflective material and for example at least one metal, so as to cover the first, second and third pads $6_1$, $6_2$, $6_3$. The thin layer thus continuously coats the upper surfaces $7_1$, $7_2$, $7_3$ and the lateral flanks $8_1$, $8_2$, $8_3$ of the pads $6_1$, $6_2$, $6_3$. It may have a substantially uniform thickness, for example, equal to about 100 nm, on the lateral flanks 8 of the pads 6.

Figure 6I:
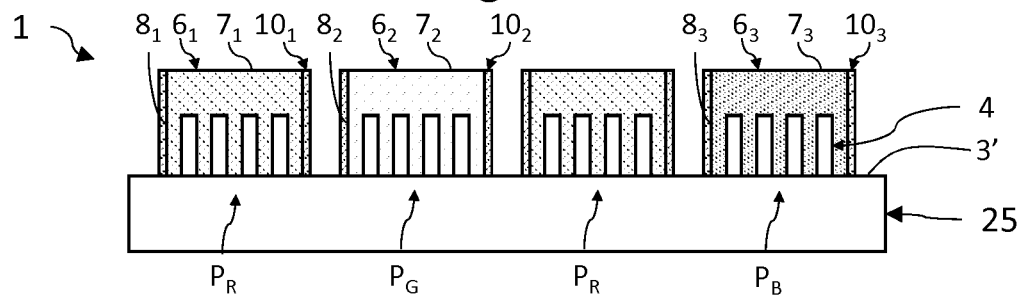

FIG. 6I illustrates a step of forming reflective walls $10_1$, $10_2$, $10_3$ covering the lateral flanks $8_1$, $8_2$, $8_3$ by locally etching the thin layer 9. Thus, the portions of the thin layer 9 that cover the upper surfaces $7_1$, $7_2$, $7_3$ are etched, here by dry etching. The portions of the thin layer 9 that rest on the surface 3' of the supporting layer 25 are also etched.

Thus, with the manufacturing method according to the third embodiment, it is possible to obtain an optoelectronic device the wire-type light-emitting diodes of which are located inside the photoresist pads, at least some of which are photoluminescent. A high resolution may be obtained because the photoresist pads are produced by photolithography and because the photoluminescent particles are quantum dots.

Figure 7:
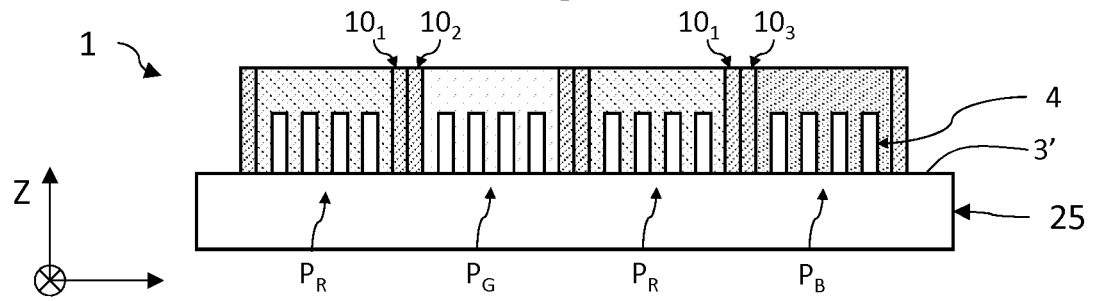
FIG. 7 is a schematic partial cross-sectional view of an optoelectronic device obtained by one variant of the method according to the second embodiment, in which the reflective walls of two adjacent photoluminescent pads make contact with each other.

FIG. 7 illustrates a variant of the method according to the third embodiment in which the thin reflective layer 9 is deposited so that its thickness on the lateral flanks $8_1$, $8_2$, $8_3$ of the pads $6_1$, $6_2$, $6_3$ is larger than half the distance that separates two neighbouring pads in the XY-plane. Thus, in the step of depositing the thin layer 9, a contact is obtained between the mutually facing reflective walls to of two neighbouring pads 6.

As a variant of FIG. 7 and of the third embodiment described above, the reflective walls 10 may be formed by electrodeposition. More precisely, as illustrated in FIGS. 6A-6G, photoresist pads 6 are produced that rest on a surface 3' of the supporting layer 25. A thin growth track, produced from at least one metal, for example from titanium, copper or aluminium, is located on the surface 3' of the supporting layer 25, and extends between pairwise neighbouring pads 6, so as to encircle each of the pads 6. Next, as a variant to FIGS. 6H and 6I, the reflective walls to are produced by electrodeposition of a reflective material, such as a metal, for example nickel, aluminium or silver. The metal then grows from the thin growth layer, and fills the space bounded by the mutually facing lateral flanks 8. The metal thus covers the lateral flanks of the pads 6 and forms the reflective walls. The optoelectronic device 1 is then similar to that illustrated in FIG. 7 in the sense that the reflective walls to fill the space formed between neighbouring pads 6. By way of illustration, the distance between two neighbouring pads 6 may be comprised between 0.5 m and 5 m.

As a variant to the method according to the third embodiment described above, the first, second and third photoluminescent pads 6, and the corresponding reflective walls to may be produced successively. More precisely, similarly to the second embodiment, the first photoluminescent pads $6_1$ are formed, then the first reflective walls $10_1$ are formed, then the second photoluminescent pads $6_2$ are formed, then the second reflective walls $10_2$ are formed, and so on.

Particular embodiments have just been described. Various variants and modifications will seem obvious to those skilled in the art. Thus, the light-emitting diodes may be suitable for emitting excitation light in a colour other than the blue, and the various photoluminescent pads may be suitable for converting the excitation light into colours other than the red and the green. Furthermore, the pads may not contain any photoluminescent particles. Moreover, generally, the photoluminescent pad 6 may have thicknesswise and/or widthwise dimensions that are different from one another.

The invention claimed is:

1. A method for producing an optoelectronic device, wherein said optoelectronic device includes a matrix array of light-emitting diodes and photoluminescent pads, wherein each of said photoluminescent pads faces at least some of said light-emitting diodes, said method comprising forming said photoluminescent pads by photolithography from at least one photoresist that contains photoluminescent particles, said at least one photoresist having been deposited beforehand on a supporting surface, and forming reflective walls covering lateral flanks of said photoluminescent pads by deposition of at least one thin-layer section on said lateral flanks.

2. The method of claim 1, wherein forming said reflective walls comprises conformally depositing at least one thin layer made of a reflective material so as to cover said photoluminescent pads and, after having done so, locally etching said at least one thin layer so as to free an upper surface of said photoluminescent pads, said upper surface being located opposite said supporting surface.

3. The method of claim 2, wherein said forming said photoluminescent pads and forming said reflective walls includes forming first photoluminescent pads by photolithography from a first photoresist containing first photoluminescent particles, said first photoresist having been deposited beforehand on said supporting surface, forming first reflective walls covering lateral flanks of said first photoluminescent pads by conformally depositing a thin reflective layer on said first photoluminescent pads and then etching locally so as to free an upper surface of said first photoluminescent pads, forming second photoluminescent pads by photolithography from a second photoresist containing second photoluminescent particles, said second photoresist having been deposited beforehand on said supporting surface, said second photoluminescent particles differing from said first photoluminescent particles.

4. The method of claim 3, further comprising, following forming said second photoluminescent pads, forming second reflective walls covering lateral flanks of said second photoluminescent pads by conformally depositing a thin reflective layer on said first and second photoluminescent pads and then etching locally so as to free said upper surface of said first and second photoluminescent pads.

5. The method of claim 3, wherein each of said second photoluminescent pads contacts at least one of said first reflective walls.

6. The method of claim 2, wherein each of said first reflective walls has a thickness that is between ten nanometers and five hundred nanometers.

7. The method of claim 1, wherein forming said photoluminescent pads includes forming first photoluminescent pads containing first photoluminescent particles and forming second photoluminescent pads containing second photoluminescent particles that are different from said first photoluminescent particles, wherein forming said reflective walls comprises forming said reflective walls after said first and second photoluminescent pads have been formed.

8. The method of claim 7, wherein forming said reflective walls comprises forming said reflective walls by electrodeposition.

9. The method of claim 1, wherein said photoluminescent particles are quantum dots that have an average size that is no greater than fifty nanometers.

10. The method of claim 1, wherein said light-emitting diodes are elongated three-dimensional components that extend longitudinally substantially orthogonally to a main plane of said supporting surface.

11. The method of claim 10, wherein said light-emitting diodes are located inside said photoluminescent pads and wherein at least some of said photoluminescent pads include photoluminescent particles.

12. The method of claim 1, wherein said photoluminescent pads rest on said supporting surface, wherein said supporting surface is a transmission surface, and wherein a spacer layer that covers said light-emitting diodes forms said supporting surface.

13. The method of claim 1, further comprising causing said light-emitting diodes to have a three-dimensional structure that is elongated along a longitudinal axis that is orthogonal to said supporting layer.

14. The method of claim 1, further comprising causing said light-emitting diodes to be located inside said first or second photoluminescent pads.

15. The method of claim 1, further comprising causing said light-emitting diodes to have a mesa structure.

16. An apparatus comprising an optoelectronic device, said optoelectronic device comprising a matrix array of light-emitting diodes resting on a supporting layer, first photoluminescent pads, and second photoluminescent pads, wherein each of said first photoluminescent pads is located facing at least some of said light-emitting diodes, wherein each of said first photoluminescent pads is formed from a first photoresist that includes first photoluminescent particles, wherein each of said first photoluminescent pads comprises lateral flanks covered by a deposited thin-layer section forming a first reflective wall, wherein each of said second photoluminescent pads faces at least some of said light-emitting diodes, wherein second photoluminescent pads is formed from a second photoresist that includes second photoluminescent particles, wherein said second photoluminescent particles differ from said first photoluminescent particles, and wherein said second photoluminescent pads comprise lateral flanks that are covered by a deposited thin-layer section that forms a second reflective wall wherein the optoelectronic device is specially adapted for being manufactured by a process that comprises forming said photoluminescent pads by photolithography from at least one photoresist that contains photoluminescent particles, said at least one photoresist having been deposited beforehand on a supporting surface and forming reflective walls covering lateral flanks of said photoluminescent pads by deposition of at least one thin-layer section on said lateral flanks.

* * * * *